(12) United States Patent
Suzuki et al.

(10) Patent No.: US 7,230,685 B2
(45) Date of Patent: Jun. 12, 2007

(54) APPARATUS, METHOD, AND PROGRAM FOR GENERATING RANGE-IMAGE-DATA

(75) Inventors: Yousuke Suzuki, Toyota (JP); Hitoshi Yamada, Obu (JP); Ryoichi Sugawara, Nagoya (JP); Naoki Sano, Obu (JP)

(73) Assignee: DENSO Corporation, Kariya (JP)

( * ) Notice: Subject to any disclaimer, the term of this patent is extended or adjusted under 35 U.S.C. 154(b) by 288 days.

(21) Appl. No.: 11/007,258

(22) Filed: Dec. 9, 2004

(65) Prior Publication Data
US 2005/0162638 A1 Jul. 28, 2005

(30) Foreign Application Priority Data
Jan. 28, 2004 (JP) ............................. 2004-020414

(51) Int. Cl.
*G01C 3/08* (2006.01)
(52) U.S. Cl. ..................... 356/4.04; 356/4.07; 356/614; 382/106
(58) Field of Classification Search ................ 356/4.04
See application file for complete search history.

(56) References Cited

U.S. PATENT DOCUMENTS
6,373,557 B1* 4/2002 Mengel et al. ............. 356/4.07
* cited by examiner

*Primary Examiner*—Thomas H. Tarcza
*Assistant Examiner*—Timothy Brainard
(74) *Attorney, Agent, or Firm*—Posz Law Group, PLC

(57) ABSTRACT

First image data including a first pixel value according to the intensity of background light is obtained by means of only exposure. Second image data including a second pixel value according to the intensity of the light reflected or scattered by an object is obtained by so controlling light emission and exposure as to receive part of the reflected or scattered light over the whole exposure period. The part of the reflected or scattered light corresponds to the flat period of emitted pulsed light. Third image data including a third pixel value according to the distance to the object is obtained by so controlling light emission and exposure as to receive the part of the reflected or scattered light for a time according to the distance. The first pixel value is subtracted from each of the second and third pixel values so that the influence of the background light can be excluded. The ratio between the subtraction results is calculated so that the influences of factors that vary the intensity of the reflected or scattered light can be cancelled.

17 Claims, 11 Drawing Sheets

APPARATUS, METHOD, AND PROGRAM FOR GENERATING RANGE-IMAGE-DATA

CROSS REFERENCE TO RELATED APPLICATION

This application is based upon, claims the benefit of priority of, and incorporates by reference the contents of Japanese Patent Application No. 2004-20414 filed on Jan. 28, 2004.

FIELD OF THE INVENTION

The present invention relates to an apparatus, a method, and a program for generating range-image-data using pulsed light.

BACKGROUND OF THE INVENTION

An apparatus that emits pulsed light, receives light reflected or scattered from an object located in a preset measuring range by means of a photosensor having a plurality of pixels, and generates range images from the output from the photosensor is known. (for example, refer to Published Japanese translation No. 2002-500367 of PCT application).

A range image represents the distance to a photographed object by image gradations (pixel values). The use of a range image makes it possible to measure at a time the distances to a plurality of objects located in a wide range.

In the apparatus disclosed in Published Japanese Application No. 2002-500367, as shown in FIG. 12A, the pulse width of the pulsed light and the exposure period (exposure time) of the photosensor are set to $\Delta L$ and $\Delta A$ ($\leq \Delta L$), respectively, and the emission of the pulsed light and the exposure of the photosensor start simultaneously so that each pixel of the photosensor stores a charge according to the distance D to the object.

In other words, the reception of the light reflected or scattered from the object is delayed from the emission of the pulsed light by time $\tau(=2D/VC$, where VC is the speed of light) according to the distance R to the object. For this reason, each pixel of the photosensor receives the reflected or scattered light for the period (charge storage time) $\Delta A - \tau$ during the exposure period. That is, the longer the distance R to the object is, the less the charge Q stored in each pixel of the photosensor is.

However, even if the storage time is the same, the stored charge Q increases as the intensity of the reflected or scattered light increases. Also, even if the distance to the object is the same, the intensity of the reflected or scattered light varies with the light reflection coefficient or light scattering coefficient of the surface of the object. For this reason, it is necessary to standardize the stored charge Q in order to obtain from the charge a pixel value of the range image correctly representing the distance to the object.

The apparatus disclosed in Published Japanese Application No. 2002-500367 carries out this standardization by setting the exposure time $\Delta B$ of the photosensor so as to enable definite reception of all the reflected or scattered light and measure the charge Qc per unit time (pulse width $\Delta L$) due to the reflected or scattered light from the object separately from the stored charge Q related to the distance R.

By finding the ratio between the stored charge Qc per unit time and the stored charge Q related to the distance R obtained by the previous measurement(=Q/Qc), a pixel value can be obtained that is standardized so as to be related only to the distance R to the object and unrelated to the intensity of the reflected or scattered light.

The pulsed light emitted toward the measuring range not only scatters while it is flying, but is also absorbed and scattered by the surface of the object. For this reason, the intensity of the reflected or scattered light received by the photosensor, and consequently the output from the photosensor, is extremely low. It is therefore necessary to increase the emission intensity of the pulsed light to enable detection of objects positioned at points distant from the apparatus and having a low reflection coefficient (for example, a black object).

However, the output power of a light emitting element such as a light emitting diode or a laser diode employed as a pulsed light source is difficult to boost without sacrificing high speed due to such constraints as the effect of parasitic elements and the current capacity of the power MOSFET that drives the light emitting element. Actually, the rise time of the pulsed light emitted by a light emitting element for emission of several watts is on the order of several hundred nanoseconds. Particularly, if the driver of the light emitting element includes a CMOS inverter, the rise time of the pulsed light, when charges are supplied via a PMOSFET, is even longer because the current driving capacity of a PMOSFET is low compared to an NMOSFET.

If the object is in relatively close range, for example, within 10 meters, the delay time $\tau$ (light flight time) of the reflected or scattered light with respect to the emitted light is 67 nanoseconds or less, which is obviously shorter than the rise time of the pulsed light. That is, as shown in FIG. 12B, the conventional apparatus has the problem in that a measurement of good accuracy cannot be carried out because measurement is performed using the rise period, when the light intensity varies.

When obtaining the stored charge Qc per unit time in the conventional apparatus, because the exposure time $\Delta B$ is set longer than the pulse width $\Delta L$ of the pulsed light, the period for receiving only the background light, which becomes noise, during the exposure period is longer, so that the S/N ratio of the stored charge Qc is unnecessarily decreased. This leads as a result to the problem of further degrading the measurement accuracy.

In the conventional apparatus, when obtaining the stored charge Q related to the distance D, the charge storage time increases to as long as when receiving light that is reflected or scattered from close range having a strong reception intensity. Because of this, saturation of the output (stored charge) from the photosensor easily occurs. Lowering the emission intensity to prevent this saturation gives rise to the problem of restricting the measuring range (the maximum allowable distance for detection of the object).

SUMMARY OF THE INVENTION

An object to solve the aforementioned problems is to provide an apparatus, a method, and a program for generating range-image-data having a wide measuring range and capable of obtaining range-image-data with a high range accuracy.

The apparatus includes a light-emitting means, an imaging means, an image-data-obtaining means, and a range-image-data-generating means. The light-emitting means emits pulsed light within a preset measuring range. The pulsed light has a rise period, a flat period, and a fall period. The imaging means photographs an object existing in the measuring range. The imaging means includes a photosensor consisting of a two-dimensional array of charge integration type photoelectric conversion elements and is capable of adjusting the exposure time of the photosensor.

The image-data-obtaining means obtains image data by controlling the emission period or the emission-start timing for the light-emitting means and the exposure period or the exposure-start timing for the imaging means. The image data is obtained from the value of each pixel, which is the output of the photoelectric conversion elements. A range-image-data-generating means generates range-image-data based on the obtained image data. The range-image-data consists of pixel values corresponding to the distance to the photographed object.

The image-data-obtaining means includes a first image-data-obtaining means, a second image-data-obtaining means, and a third image-data-obtaining means. The first image-data-obtaining means obtains first image data from the imaging means by operating the imaging means to make an exposure, without operating the light-emitting means to emit pulsed light. The second image-data-obtaining means obtains second image data from the imaging means by setting the emission period or the emission-start timing and the exposure period or the exposure-start timing in order to receive a part of the light reflected or scattered from the object during the whole exposure period. This part of the reflected or scattered light corresponds to the flat period of the pulsed light. The third image-data-obtaining means obtains third image data from the imaging means by setting the emission period or the emission-start timing and the exposure period or the exposure-start timing in order to receive a part of the reflected or scattered light during a period corresponding to the distance of the round-trip to the object. This part of the reflected or scattered light corresponds to the flat and fall periods of the pulsed light.

The value of each pixel of the first image data represents an offset level, which consists of the reception level of the incident (background) light other than the reflected or scattered light and noises due to the operation of the pixel. The value of each pixel of the second image data represents the reference level of the light reflected or scattered by the object. The value of each pixel of the third image data represents intensity according to the distance to the object.

The second image data is obtained by receiving only the flat period of the pulsed light. The third image data is obtained by receiving only the flat and fall periods of the pulsed light. Consequently, none of the first to third image data is influenced by the rise period of the pulsed light.

The range-image-data-generating means includes a first arithmetic means, a second arithmetic means, and a third arithmetic means. The first arithmetic means finds reference image data by subtracting the first image data from the second image data. The second arithmetic means finds intensity image data by subtracting the first image data from the third image data. The third arithmetic means finds the range-image-data by calculating the ratio between the reference and intensity image data.

Thus, in the apparatus according to the present invention, the first to third image data are obtained without using the rise period of the pulsed light, when the light intensity is not stable. When the second image data is obtained, the reflected or scattered light is received over the entire exposure period, and there is no period when it receives only the background light, which becomes noise, so that the SN ratio of the second image data is not too low.

By finding the reference and intensity image data, it is possible to exclude the offset component. By finding the ratio between the reference and intensity image data, it is possible to cancel the influences of factors that vary the reception level of the reflected or scattered light depending on changing conditions. The factors may be the reflection coefficient of the surface of the object, the dark currents flowing through the photoelectric conversion elements, the operating noise due to the operation for exposure, and the thermal noise of elements.

Accordingly, the apparatus makes it possible to obtain accurate range-image-data having pixel values according to only the distances to an object.

As shown in FIG. 4B, the second image-data-obtaining means may set the exposure period (pulse width Tsh2 of exposure signal SH) arbitrarily. The second image-data-obtaining means may also set the emission period (pulse width Tf2 of emission signal FL) equal to the sum of the rise period (Tup) of the pulsed light, the maximum round-trip time (Tmax) taken by the pulsed light to make a round trip over the distance to the boundary of the measuring range, and the exposure period (Tsh2). The emission from the light-emitting means may start before the exposure of the photosensor by a time equal to or longer than the sum of the rise period and the maximum round-trip time (Tup+Tmax).

As shown in FIG. 4C, the third image-data-obtaining means may set the emission period (pulse width Tf3 of emission signal FL) so that the flat period (Tc) is equal to the maximum round-trip time (Tmax). The third image-data-obtaining means may also set the exposure period (pulse width Tsh3 of exposure signal SH) equal to or longer than the flat period (Tc=Tmax). The emission may start before the exposure by the sum of the rise period and the maximum round-trip time (Tup+Tmax).

In this case, the shorter the distance (0–Tmax) to the object is, the shorter the period when the reflected or scattered light is received within the exposure period (Tsh3) is. Accordingly, even when receiving the light reflected or scattered by an object existing at a distance which is so short that a relatively high reception level can be obtained, it is difficult to saturate the output from the photoelectric conversion elements. Consequently, the capacity of the photoelectric conversion elements can be utilized to the maximum.

The longer the distance to the object is, the longer the period when the reflected or scattered light is received within the exposure period is. Accordingly, even when receiving the light reflected or scattered by an object existing at a distance that is so long that only a low reception level can be obtained, it is possible to obtain high output from the photoelectric conversion elements in comparison with the conventional apparatus. Consequently, when the emission intensity of the pulsed light is the same, and when the light reflected or scattered by an object existing at the same distance is received, the apparatus accordingly makes it possible to obtain higher output (pixel values) and improve its measurability (widen the measuring range) in comparison with the conventional apparatus.

It is preferable that the exposure periods set by the first to third image-data-obtaining means be equal. However, at least one of the first and second image-data-obtaining means may set the associated exposure period different from the exposure period set by the third image-data-obtaining means. In this case, the first and second arithmetic means may find the reference and intensity image data by standardizing the pixel values of the first to third image data to values per preset unit time.

If the exposure periods are set equal, it is possible to omit the operation for standardizing the pixel values of the first to third image data to values per unit time by means of the first and second arithmetic means.

At least one of the exposure periods set by the first to third image-data-obtaining means may be divided into a plurality of periods. In this case, it is possible to reduce the influence of suddenly produced extraneous light (noise) incident on the photoelectric conversion means.

The first and second arithmetic means may accumulate pixel values of the reference and intensity image data. The third arithmetic means may generate the range-image-data based on the reference and intensity image data having the accumulated pixel values.

In this case as well, it is possible to reduce the influence of suddenly produced extraneous light (noise).

The apparatus according to the present invention may also include a distance-calculating means for finding the absolute distance to the object based on the range-image-data generated by the third arithmetic means.

The distance-calculating means may find the absolute distance to the object by multiplying the value of each pixel of the range-image-data by a preset constant.

Alternatively, the distance-calculating means may find the absolute distance to the object by using a prepared conversion table showing the relation between the pixel value and the absolute distance.

At least one of the pixels of the photoelectric conversion elements may be a reference pixel so set as to receive the light reflected or scattered from a reference object. The distance between the reference pixel and the reference object is already known. The distance-calculating means may correct the absolute distance between each pixel and the object in the measuring range based on the absolute distance calculated for the reference pixel.

Even if the characteristics of the apparatus according to the present invention change due to aging or the like, it is possible to correct the change based on the measured value for the reference pixel. This makes it possible to obtain accurate range-image-data for a long time.

The apparatus according to the present invention may also include a saturation-time-measuring means for measuring the saturation time taken by the output (pixel values) from the photoelectric conversion elements to be saturated while the light-emitting means and the imaging means are making an emission and an exposure, respectively. The second image-data-generating means may set the exposure period equal to or shorter than the saturation time.

This makes it possible to utilize the capacity of the photoelectric conversion elements most effectively.

It is preferable that the measuring light is invisible. For example, the near infrared ray, with which the wavelength of 850 nanometers, is appropriate. In this case, it is preferable in terms of production costs and sensitivity that each of the photoelectric conversion elements is a PIN type photodiode including a P-layer, an N-layer, and an I-layer, which has low impurity concentration and is interposed between the two aforementioned regions.

A PIN type photodiode can be produced at low cost by a general CMOS process and is sensitive because its I layer is thick enough to receive the incident light.

A general image sensor stores charge by utilizing the junction capacitance of a photodiode. Since the junction capacitance varies with voltage in such an image sensor, the amount of charge and the output voltage do not have a linear characteristic and produce errors.

Therefore, it is preferable that the charge generated by each of the photoelectric conversion elements be stored in a capacitor provided separately from them. The storage of a charge in a capacitor, which is not voltage-dependent, enables the relationship between the amount of stored charge and the output voltage to approximate a linear characteristic. This makes it possible to curb the errors that would be produced when the characteristic were nonlinear.

A second aspect is a method for generating range-image-data based on image data such that the values of pixels are the output from a photosensor consisting of a two-dimensional array of charge integration type photoelectric conversion elements. The method comprises:

the first step of obtaining first image data from the photosensor by exposing the photosensor without irradiating an object in a preset measuring range;

the second step of obtaining second image data from the photosensor by irradiating the object with the pulsed light and so exposing the photosensor to receive the light reflected or scattered from the object, which is corresponding to the flat period of the pulsed light;

the third step of obtaining third image data from the photosensor by irradiating the object with the pulsed light and exposing the photosensor so that the photosensor receives the reflected or scattered light for the round-trip time corresponding to the distance to the object, which is corresponding to the flat and fall periods of the pulsed light;

the fourth step of finding reference image data by subtracting the first image data from the second image data;

the fifth step of finding intensity image data by subtracting the first image data from the third image data; and the sixth step of finding the range-image-data by calculating the ratio between the reference and intensity image data.

The method for generating range-image-data can be performed by the apparatus according to the present invention to obtain an effect similar to that obtained by this apparatus.

The steps of the method for generating range-image-data may be executed by means of a computer program. The program may be stored in a record medium that can be read by a computer. The stored program may be loaded into a computer system and started. The record medium may be either portable or built into the computer system. Alternatively, the program may be loaded into the computer system through a network.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENTS

Embodiments of the present invention will be described below with reference to the drawings.

First Embodiment

Figure 1:
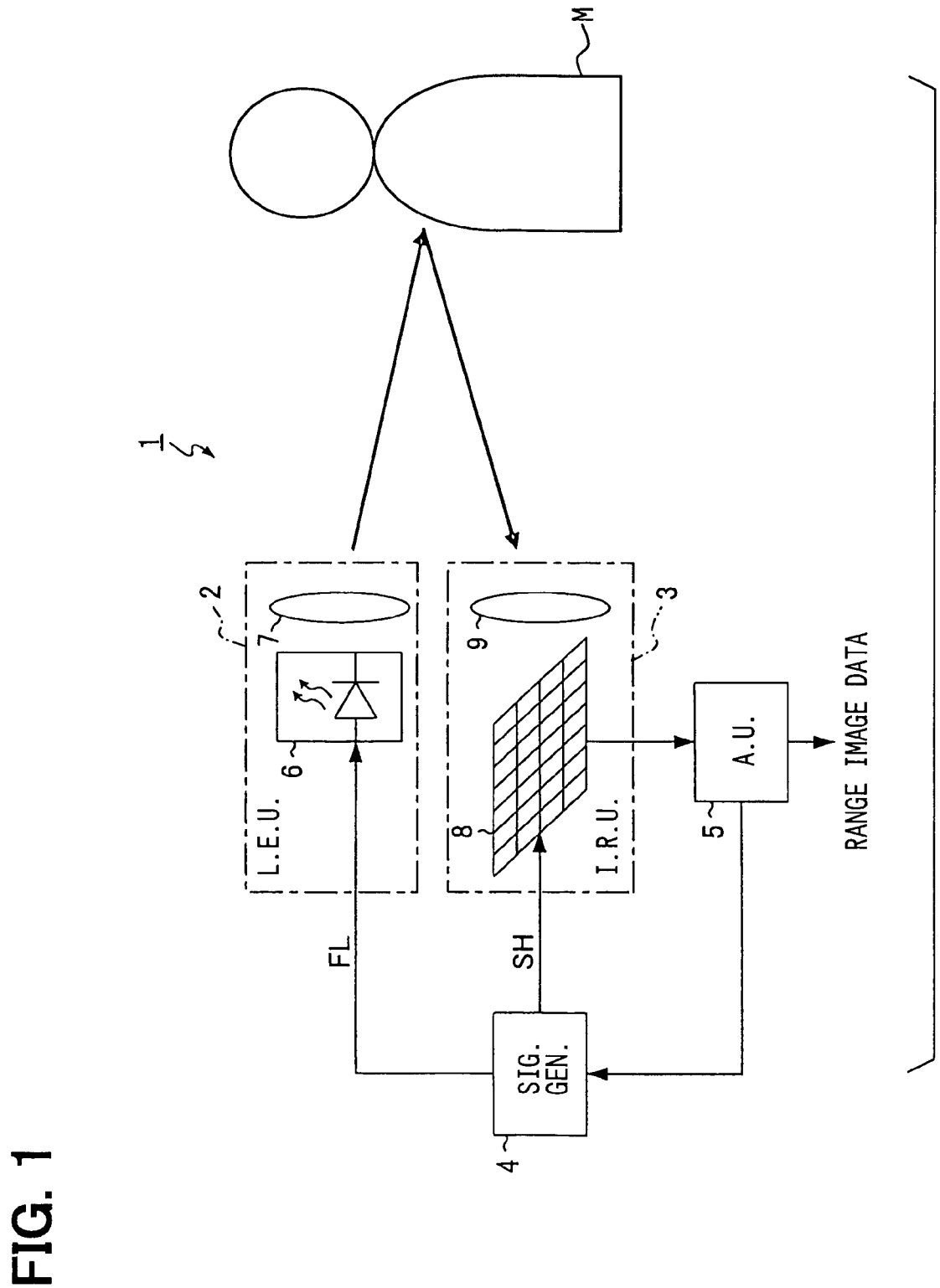
FIG. 1 is a block diagram of a range-image-data-generating apparatus according to a first preferred embodiment.

FIG. 1 is a block diagram showing the whole configuration of a range-image-data-generating apparatus 1 according to a first embodiment. The range-image-data-generating apparatus 1 includes a light emitting unit 2, an image receiving unit 3, a control signal generating unit 4, and an arithmetic unit 5. The light emitting unit 2 emits pulsed light in accordance with an emission signal FL. The image receiving unit 3 receives an image of the objects in a predetermined measuring area in accordance with an exposure signal SH. The control signal generating unit 4 generates emission signal FL and exposure signal SH. The arithmetic unit 5 so controls the control signal generating unit 4 as to generate range-image-data based on the image data from the image receiving unit 3.

The light emitting unit 2 is either a laser diode (LD) or a light emitting diode (LED), which emits near infrared rays. The light emitting unit 2 includes a light emitting element 6 and a diffusing lens 7. The light emitting element 6 can be driven in accordance with the emission signal FL. The diffusing lens 7 diffuses the light emitted from the light emitting element 6. The diffused light is emitted over the whole measuring area. A CMOS inverter circuit is used in the output stage of the drive circuit for driving the light emitting element 6. Consequently, the fall period when the light emitting element 6 is driven by an NMOS is shorter than the rise period when this element is driven by a PMOS.

The image receiving unit 3 includes a photosensor 8 and a condensing lens 9. The photosensor 8 converts incident light into an electric signal. The condensing lens 9 condenses the light from the measuring area. The condensed light is incident on the photosensor 8.

Figure 2:
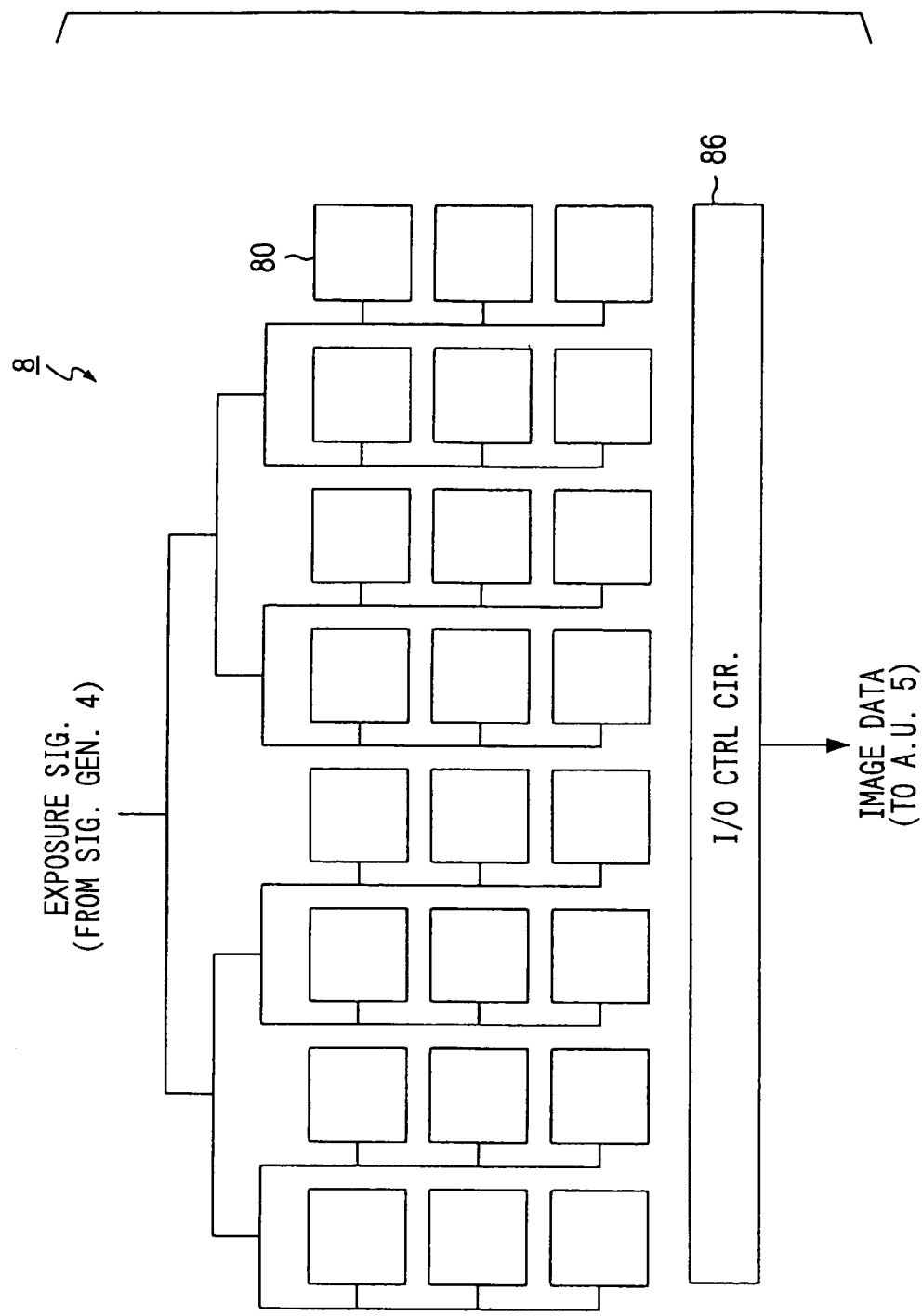
FIG. 2 is a schematic diagram of the sensor of the range-image-data-generating apparatus.

As shown in FIG. 2, the photosensor 8 consists of unit circuits 80 and an input/output control circuit 86. Each unit circuit 80 includes a photoelectric conversion element 81, which will be described later. The receiving surfaces of the photoelectric conversion elements 81 of the unit circuits 80 make an array. The input/output control circuit 86 sequentially reads out the outputs from the unit circuits 80 and supplies them to the arithmetic unit 5. The unit circuits 80 can be supplied with control signals such as exposure signal SH through signal lines of the same length (wired in the form of a tree) so that the transmission delay of the control signals can be equal.

Figure 3:
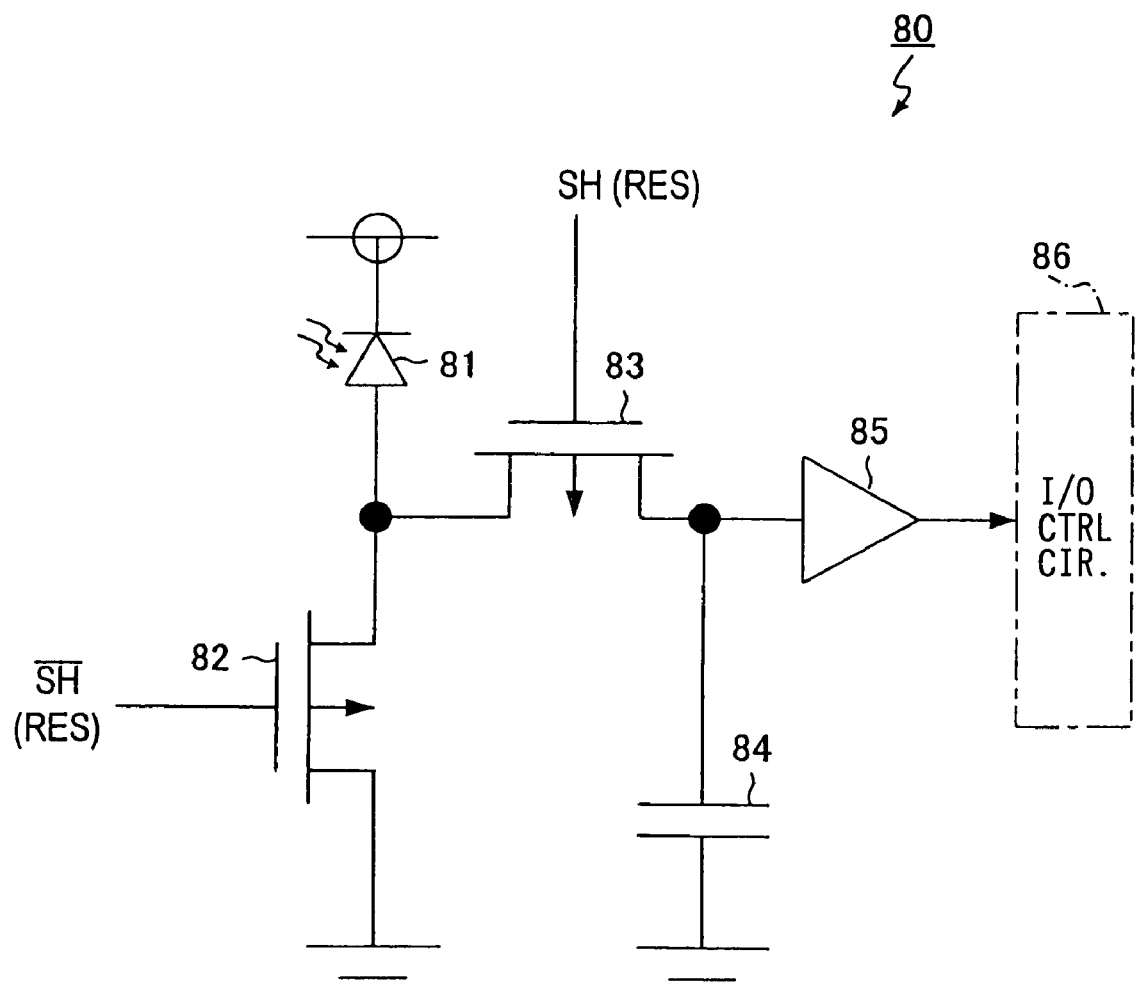
FIG. 3 is a circuit diagram of a unit circuit of the sensor.

FIG. 3 is a circuit diagram showing the structure of each unit circuit 80. As shown in FIG. 3, each unit circuit 80 includes a photoelectric conversion element 81, a charge reset switch 82, a shutter switch 83, a capacitor 84, and an amplifier 85. The switches 82 and 83 are NMOS field-effect transistors. The photoelectric conversion element 81 is grounded via the charge reset switch 82. The photoelectric conversion element 81 generates a charge in proportion to the intensity of the light received by it. The generated charge is supplied via the shutter switch 83 to the capacitor 84, which stores the charge. The amplifier 85 amplifies the voltage across the capacitor 84 and supplies the amplified voltage to the input/output control circuit 86.

The photoelectric conversion element 81 is a PIN-structure photodiode, the I-layer of which is about 30 micrometers. The I-layer, which is a receiving region, is thicker than that of an ordinary photodiode having a well diffusion layer. Accordingly, the PIN-structure photodiode is sensitive and particularly suitable for the reception of near infrared rays, which penetrate deep into the I-layer. The I-layer is wide and low in capacitance per unit area ($1/15$–$1/20$ of the capacitance per unit area of an ordinary photodiode), so that the PIN-structure photodiode is high in responsibility.

The capacitor 84 is independent of the junction capacitance of the photoelectric conversion element 81 and consists of parallel plates. One of the parallel plates is a semiconducting substrate, and the other is a plate made of semiconducting or metallic material. The charge generated by the photoelectric conversion element (photodiode) 81 is stored in not only its junction capacitance but also the capacitor 84. Moreover, the capacitance of the capacitor 84 is sufficiently higher than the junction capacitance of the photoelectric conversion element 81, which is voltage-dependent. The capacitance of the capacitor 84 is set at such a high value that the charge stored in both the capacitor 84 and the junction capacitance and the voltage (pixel value) from the unit circuit 80 can be regarded as having linear characteristics.

The amplifier 85 is a source follower circuit, which is simple in structure and high in impedance.

When the exposure signal SH is at the inactive level (exposure inhibition period), the shutter switch 83 is turned off, and the charge reset switch 82 is turned on. Consequently, the charge generated by the photoelectric conversion element 81 is discharged without being stored in the capacitor 84. When the exposure signal SH is at the active level (exposure period), the shutter switch 83 is turned on, and the charge reset switch 82 is turned off. Consequently, the charge generated by the photoelectric conversion element 81 is stored in the capacitor 84.

However, before an exposure (storage of charge in the capacitor 84), the two switches 82 and 83 are turned on so that all the charge stored in the capacitor 84 can be discharged.

When the exposure ends, the capacitor 84 has stored a charge according to the quantity of light received by the photoelectric conversion element 81 during the exposure. The amplifier 85 amplifies the voltage across the capacitor 84 according to the stored charge. The input/output control circuit 86 reads (inputs) the amplified voltage and outputs it as a pixel value to the arithmetic unit 5.

Returning briefly to FIG. 1, the arithmetic unit 5 outputs a first command, a second command, and a third command to the control signal generating unit 4. In accordance with these commands, the control signal generating unit 4 generates emission signal FL and exposure signal SH, which will be described below. Hereinafter:

Tup represents the rise time (rise period) of the pulsed light emitted by the light emitting unit 2;

Tdw represents the fall time (fall period) of the pulsed light;

Tc represents the time for which the signal level has a constant intensity (flat period);

Lmax represents the maximum distance that can be measured by the range-image-data processor 1;

VC represents the velocity of light;

Tmax(=2×Lmax/VC) represents the maximum round-trip time taken by light to make a round trip over the maximum distance Lmax.

Figure 4A:
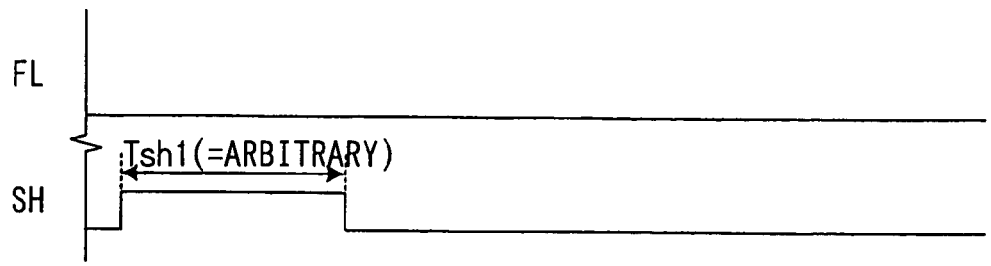
FIGS. 4A, 4B, and 4C are timing charts showing the operation of the control signal generating unit of the range-image-data-generating apparatus.

As shown in FIG. 4A, the control signal generating unit 4 generates only the exposure signal SH in response to the first command from the arithmetic unit 5. The exposure signal SH has a pulse width (exposure time) Tsh1.

Figure 4B:
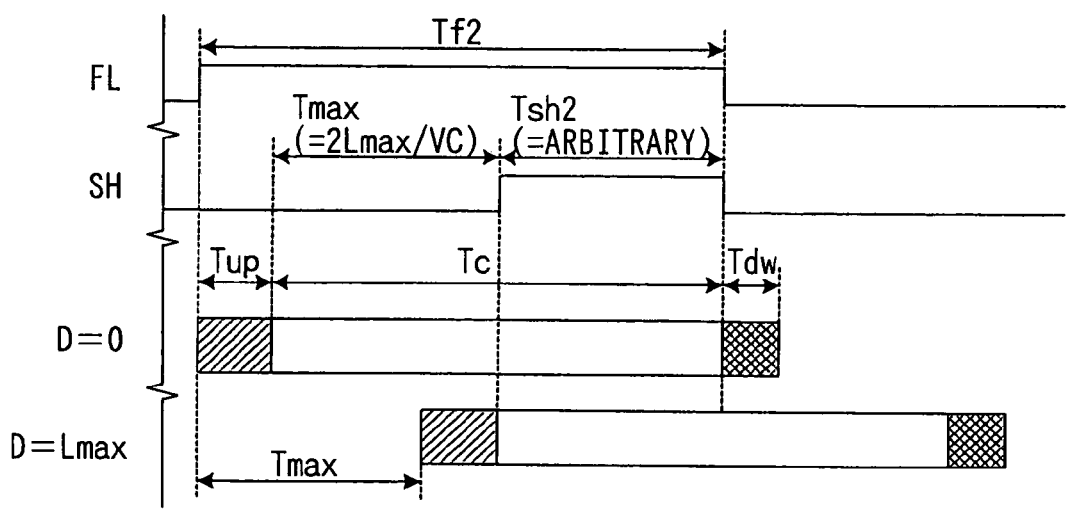

As shown in FIG. 4B, the control signal generating unit 4 generates the emission signal FL and the exposure signal SH in response to the second command from the arithmetic unit 5. The emission signal FL has a pulse width (emission time) Tf2. The exposure signal SH has a pulse width Tsh2 and is delayed for the sum of the rise time Tup and maximum round-trip time Tmax.

Figure 4C:
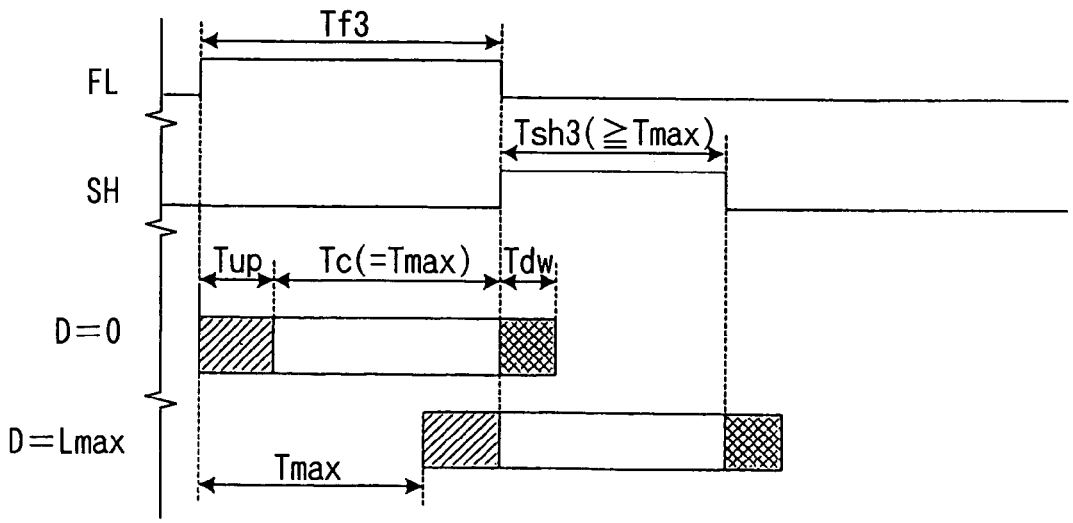

As shown in FIG. 4C, the control signal generating unit 4 generates emission signal FL and exposure signal SH in response to the third command from the arithmetic unit 5. The emission signal FL has a pulse width Tf3. The exposure signal SH has a pulse width Tsh3 and is delayed for the sum of the rise time Tup and maximum round-trip time Tmax.

The pulse widths Tsh1 and Tsh2 of exposure signals SH may be arbitrary. The pulse width Tsh3 of exposure signal SH may be equal to or greater than the maximum round-trip time Tmax. In this embodiment, however, each of the pulse widths Tsh1, Tsh2, and Tsh3 is set to the maximum round-trip time Tmax, which is the minimum value of the pulse width Tsh3 (Tsh1=Tsh2=Tsh3=Tmax).

The pulse width Tf2 of the emission signal FL is set to such a value that the constant-intensity time Tc is equal to or greater than the sum of the maximum round-trip time Tmax and exposure time Tsh2 (Tf2=Tup+Tmax+Tsh2). Accordingly, during an exposure, the light corresponding to the flat period is always received, when the light is that which is reflected or scattered by the objects in the measuring area.

The pulse width Tf3 of emission signal FL is set at such a value that the constant-intensity time Tc is equal to the maximum round-trip time Tmax (Tf3=Tup+Tmax). Accordingly, during an exposure, the light corresponding to the flat period is received for a time proportional to the distance to the objects in the measuring area, when the light is that which is reflected or scattered by the object or objects.

The arithmetic circuit 5 mainly includes a known microcomputer, which comprises a CPU, a ROM, and a RAM, and executes range-image-data generation, which will be described below.

Figure 5:
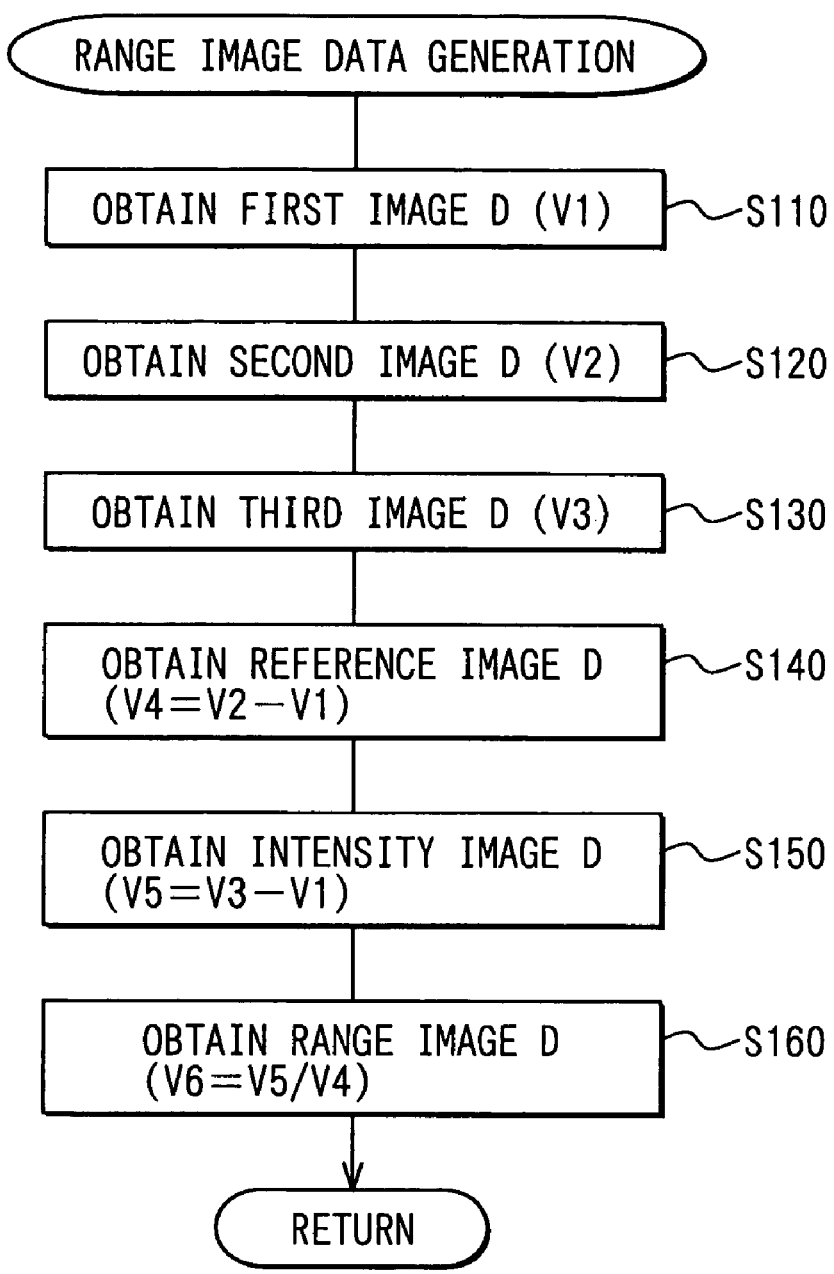
FIG. 5 is a flowchart showing the range-image-data generation executed by the arithmetic unit of the range-image-data-generating apparatus.
Figure 6:
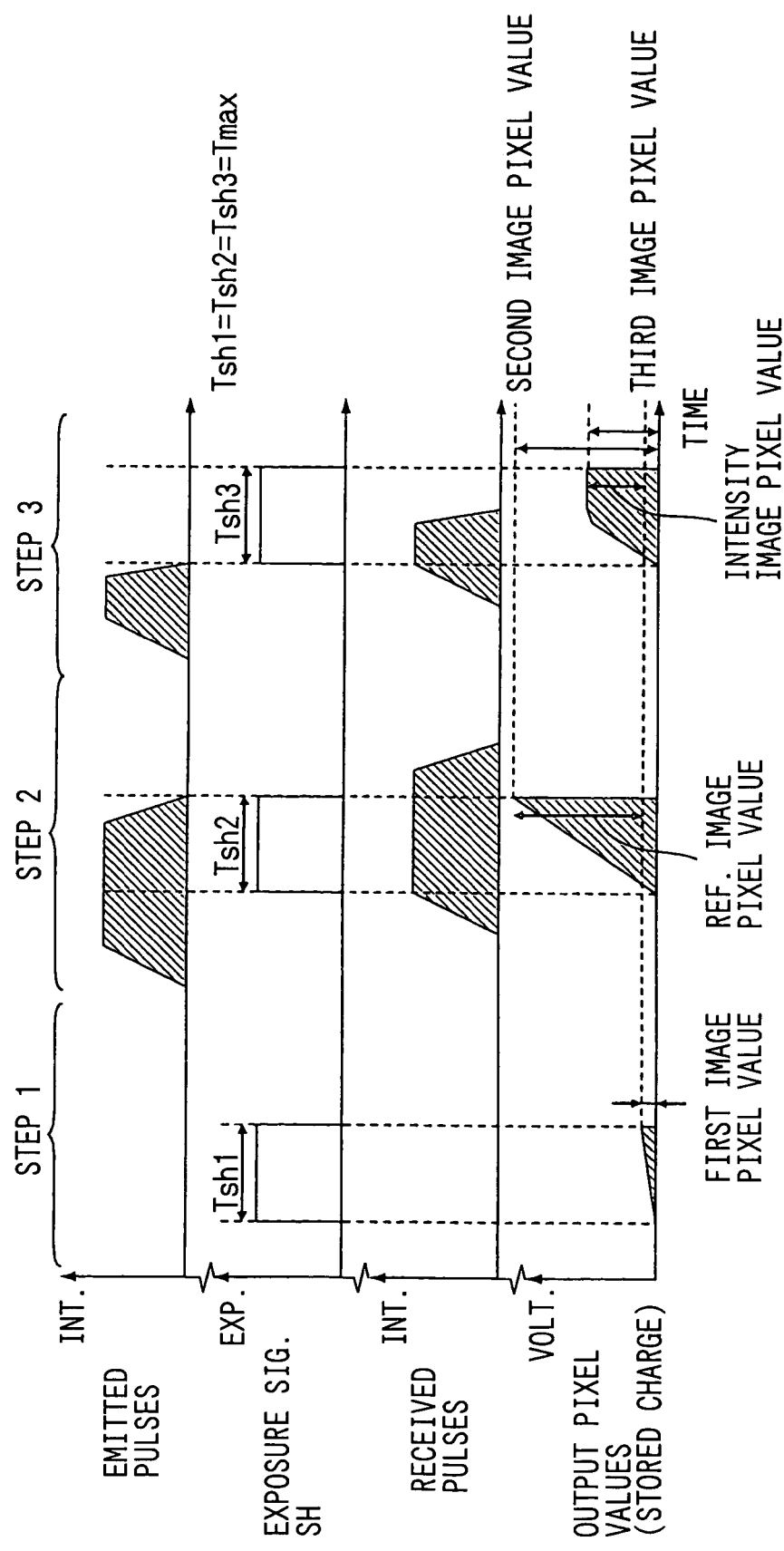
FIG. 6 is a timing chart showing the operation of various parts of the range-image-data-generating apparatus during the range-image-data generation.

FIG. 5 is a flowchart showing the range-image-data generation. FIG. 6 is a timing chart showing the relation among the pulsed light emitted from the light emitting unit 2, the pulsed light (reflected or scattered light) received by the image receiving unit 3, and the pixel value (output from each unit circuit 80) for each pixel.

With reference to FIG. 5, after the range-image-data generation starts, the first command is output to the control signal generating unit 4, causing the image receiving unit 3 to perform an exposure. After the exposure, first image data is obtained from the image receiving unit 3 (Step S110). Since the light emitting unit 2 emits no pulsed light during the exposure, the pixel value V1 (output from each unit circuit 80) of the first image data for each pixel varies with the intensity of the background light (the first step in FIG. 6).

Subsequently, the second command is output to the control signal generating unit 4, causing the light emitting unit 2 to emit light and the image receiving unit 3 to perform an exposure. After the emission and exposure, second image data is obtained from the image receiving unit 3 (Step S120). Over the entire exposure period, as stated above, the reflected or scattered light corresponding to the flat period of the emitted light is received. Accordingly, the pixel value V2 of the second image data for each pixel varies with the intensity of the reflected or scattered light (the second step in FIG. 6).

Subsequently, the third command is output to the control signal generating unit 4, causing the light emitting unit 2 to emit light and the image receiving unit 3 to perform an exposure. After the emission and exposure, third image data is obtained from the image receiving unit 3 (Step S130). During the emission and exposure, as stated above, the reflected or scattered light corresponding to the flat period of the emitted light is received for a time according to the distance to the objects having reflected or scattered the light. Accordingly, the pixel value V3 of the third image data for each pixel varies with the distance to the objects (the third step in FIG. 6).

Subsequently, the pixel value V1 of the first image data obtained at Step S110 is subtracted from the pixel value V2 of the second image data obtained at Step S120, so that a pixel value V4(=V2−V1) of reference image data is found (Step S140). Likewise, the pixel value V1 of the first image data obtained at Step S110 is subtracted from the pixel value V3 of the third image data obtained at Step S130, so that a pixel value V5(=V3−V1) of intensity image data is found (Step S150).

Consequently, the pixel value V4 of the reference image data varies with the intensity of the light reflected or scattered by the object or objects per unit exposure time, and the pixel value V5 of the intensity image data is the magnitude of the reflected or scattered light of this intensity accumulated for the time taken by the pulsed light to make a round trip over the distance to the objects.

Lastly, the pixel value V5 obtained at Step S150 is divided by the pixel value V4 obtained at Step S140, so that a pixel value V6(=V5/V4) of range-image-data is calculated (Step S160). Then, the processing ends.

The light received by the photoelectric conversion element 81 has an intensity Pr [W]. The photoelectric conversion element 81 has a conversion efficiency Kp [A/W]. The photoelectric conversion element 81 outputs a current Ipd [A], which can be expressed as the following expression (1).

$$Ipd = Kp \times Pr \quad (1)$$

The output current Ipd causes a quantity of charge Qint [C] to be stored in the capacitor 84 for an exposure time Tsh [sec] during the exposure period. The quantity of charge Qint can be expressed as the following expression (2) (1 [A]=1 [C/sec]).

$$Qint = Ipd \times Tsh \quad (2)$$

The stored charge Qint generates a voltage (pixel value) Vint [V] across the capacitor 84, which has a capacitance Cint [F]. The voltage Vint can be expressed as the following expression (3).

$$Vint = Qint / Cint \quad (3)$$

The light received by the photoelectric conversion element 81 includes the background light and the pulsed light emitted from the light emitting unit 2 and reflected or scattered. The background light consists mainly of sunlight and ambient illuminating light. The background light received by the photoelectric conversion element 81 has an intensity Pback. The reflected or scattered light received by the photoelectric conversion element 81 has an intensity Psignal. Light takes a time Tsignal(=2×Lt/VC) to make a round trip over the distance Lt (0≦Lt≦Lmax) to the objects. The pixel values V1–V3 of the first to third image data can be expressed as the following expressions (4)–(6) respectively (Tdw≈0).

$$V1 = Kp \times Pback \times Tsh1/Cint \quad (4)$$

$$V2 = Kp \times (Psignal + Pback) \times Tsh2/Cint \quad (5)$$

$$V3 = Kp \times (Psignal \times Tsignal + Pback \times Tsh3)/Cint \quad (6)$$

In consideration of Tsh1=Tsh2=Tsh3=Tmax as stated above, the pixel value V4 of the reference image data and the pixel value V5 of the intensity image data can be expressed as the following expressions (6) and (7) respectively.

$$V4 = V2 - V1 = Kp \times Psignal \times Tmax/Cint \quad (7)$$

$$V5 = V3 - V1 = Kp \times Psignal \times Tsignal/Cint \quad (8)$$

The pixel value V6 of the range-image-data can be expressed as the following expression (9).

$$V6 = V5/V4 = Tsignal/Tmax = Lt/Lmax \quad (9)$$

Thus, by processing at Steps S140–S160 the first to third image data, which are obtained at Steps S110–S130, it is possible to obtain range-image-data including the pixel value V6 which is independent of the intensity of the background light, reflected light, or scattered light, and which depends on only the distance Lt to the objects. As evident from the expression (9), it is possible to obtain the distance Lt to the objects by only multiplying the pixel value V6 of the range-image-data by the maximum measurable distance Lmax.

The intensity Pback of the background light or the intensity Psignal of the reflected or scattered light varies with the type and/or state of the objects, and/or the environment. The first to third image data are obtained at different times. Consequently, the intensities Pback and Psignal in the expressions (4) and (5) are not strictly equal. However, when the exposure periods and/or the intervals between them are sufficiently short, the intensities Pback and Psignal during these periods can be regarded as constant, so that the expressions (7)–(9) are valid.

As stated already, the range-image-data-generating apparatus 1 makes it possible to obtain the first to third image data (pixel values V1–V3) without using the rise period when the pulsed light is unstable (when the quantity of stored charge per unit time is not constant). When the second image data is obtained, as stated already, the reflected or scattered light is received over the entire exposure time, and there is no period when only the background light, which becomes noise, is received, so that the SN ratio of the second image data is not too low.

The first image data (pixel value V1) subtracted from the second and third image data (pixel values V2 and V3) leaves the reference image data (pixel value V4) and the intensity image data (pixel value V5) respectively. This excludes the influence of the background light. The ratio between the reference image data and intensity image data is the pixel value V6 of the range-image-data. This excludes the influence of factors that vary the intensity Psignal of the reflected or scattered light.

Consequently, the range-image-data-generating apparatus 1 makes it possible to obtain accurate range-image-data including pixel values dependent on only the distance to the objects.

When the third image data is obtained, when the distance to the objects is shorter, so that higher receiving intensity can be obtained, the reflected or scattered light is received for a shorter time Tsignal within an exposure period. Accordingly, in comparison with the conventional apparatus, it is difficult to saturate the output from the photoelectric conversion elements 81, so that their capacity can be utilized most effectively. When the distance to the objects is longer, so that only lower receiving intensity can be obtained, the reflected or scattered light is received for a longer time Tsignal within an exposure period. Accordingly, when the light reflected or scattered by a far object is received, it is possible to obtain higher output (pixel values) in comparison with the conventional apparatus. This makes it possible to widen the measuring range.

The signal lines through which the unit circuits 80 are supplied with the control signals are equal in length. This makes it possible to reduce the variation of exposure timing among the pixels, ensuring uniform sensitivity for all of them.

The range-image-data-generating apparatus 1 receives the light reflected or scattered by an object at a short distance (for example, some meters) for a time Tsignal of about ten nanoseconds to tens of nanoseconds. By contrast, when the photosensor 8 includes high-resolution photoelectric conversion elements or the like having a large chip area, the transmission delay in the wiring pattern of the signal lines may reach some nanoseconds to about ten nanoseconds. Accordingly, when the signal lines through which exposure signal SH is supplied varied in length, the exposure periods for the unit circuits 80 would start at different times, so that accurate output (pixel values) could not be obtained.

The range-image-data-generating apparatus 1 may be applied to a driving assistance system for a car.

Figure 7:
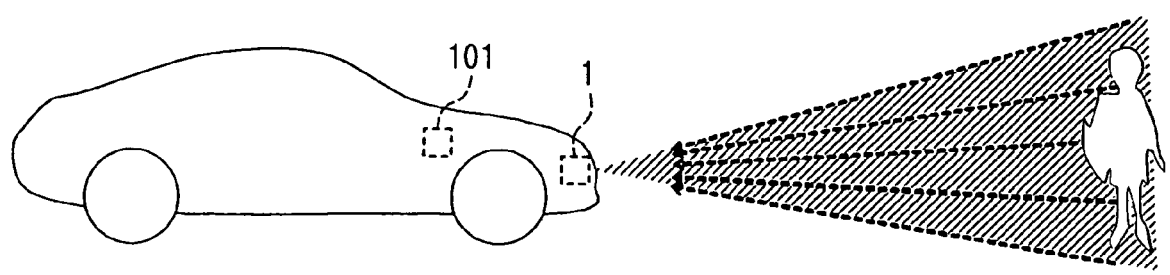
FIG. 7 schematically shows a driving assistance system, to which the range-image-data-generating apparatus is applied.

In this case, as shown in FIG. 7, the range-image-data-generating apparatus 1 is positioned to photograph the objects in front of the car. The positioned apparatus 1 is connected to a range-image-data processor 101 via the LAN in the car or a dedicated signal line (or by means of radio communication).

Based on the range-image-data supplied from the range-image-data-generating apparatus 1, the range-image-data processor 101 executes object extraction for the extraction of objects (obstacles, preceding cars, and/or walkers) to be recognized for driving assistance.

The range-image-data processor 101 groups a range image into domains by using the pixel values V6 of the range-image-data and/or the distance D found from these values (generally referred to as "distance information" hereinafter). The processor 101 then identifies the types of the objects by the shapes, sizes, and/or the like of the domains.

Thus, the driving assistance system to which the range-image-data-generating apparatus 1 is applied extracts individual objects by using distance information obtained from range-image-data. This makes it possible to reliably extract the individual objects even when they are of similar colors and overlap each other.

The range-image-data-generating apparatus 1 may also be applied to an intrusion-detection system for use in a car.

Figure 8:
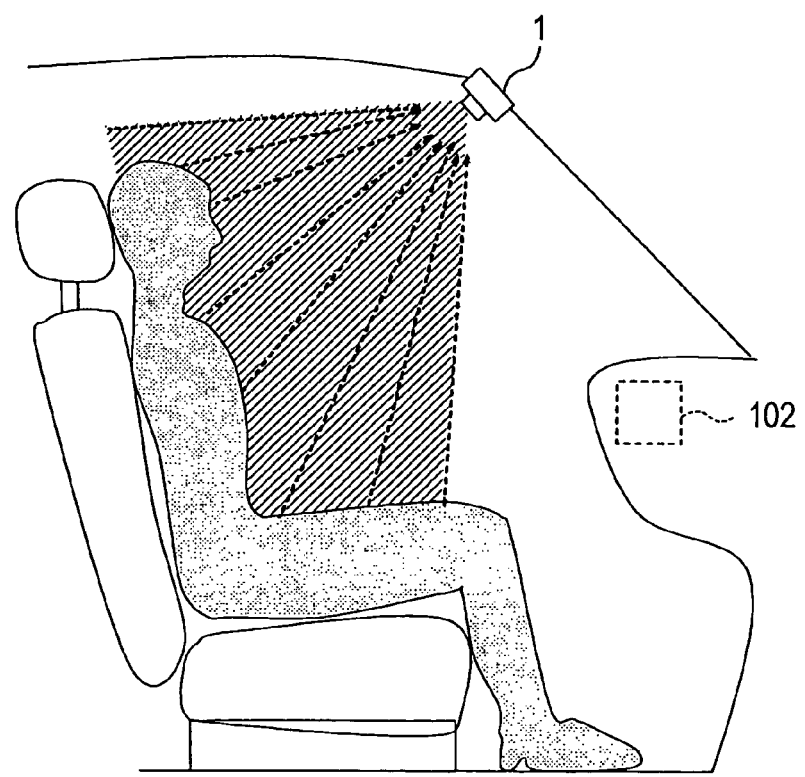
FIG. 8 schematically shows an intrusion-detection system for use in a car, to which the range-image-data-generating apparatus is applied.

In this case, as shown in FIG. 8, the range-image-data-generating apparatus 1 is disposed on the ceiling of the car and adjusted to photograph the driver and passengers. The apparatus 1 is connected to a range-image-data processor 102 via the LAN in the car or a dedicated signal line (or by wireless communication).

Based on range-image-data, the range-image-data processor 102 executes intrusion detection for the detection of an intruder into the car.

The range-image-data processor 102 compares the range-image-data supplied from the range-image-data-generating apparatus 1 and preset reference range-image-data. When the comparison reveals that there is a difference between the compared data, the range-image-data processor 102 extracts the part of the data where the difference lies. From information (shape, size, the distance to generating apparatus 1, etc.) about the extracted part, the processor 102 determines whether this part represents an intruder into the car. When the determination reveals that the extracted part represents an intruder into the car, the processor 102 sends out an alarm, a warning, or the like by means of a speaker, a lighting device, a communication device, or the like (not shown).

The reference range-image-data may be the range-image-data obtained with the engine stopped and the car locked from the outside (when no one is assumed to be in the car). Alternatively, the reference range-image-data may be the range-image-data obtained just before the intrusion detection. The range-image-data-generating apparatus 1 might perform processing up to the determination of intrusion into the car. In this case, the range-image-data processor 102 could perform only warning processing or the like.

Thus, the intrusion-detection system to which the range-image-data-generating apparatus 1 is applied ensures that shadows projected into the car and objects viewed through the glass are prevented from being detected erroneously as intruders. This improves the detection reliability.

The general image processing based on the colors and/or gradations of pixels does not make it possible to determine the distance to an object. Accordingly, it is difficult to determine, by this processing, whether the extracted objects are shadows projected into the car or real bodies existing in it, and whether objects viewed through the glass are positioned inside or outside the car. By utilizing distance information based on range-image-data, it is possible to easily and reliably determine whether the extracted objects are shadows projected into the car or real bodies existing in it, and whether objects viewed through the glass are positioned inside or outside the car.

The range-image-data-generating apparatus 1 may further be applied to collect information for expansion control of an air bag. In this case, it is possible to use a system similar to the intrusion-detection system (FIG. 8).

Based on the range-image-data generated from the range-image-data-generating apparatus 1, the range-image-data processor 102 detects whether someone is in the car, the position and shape of his/her head, his/her position, and/or other information. Based on the detected information, the processor 102 controls the position where the air bag should expand, the speed at which it should expand, etc.

It is possible to group the object in an image reliably at high speed by processing the image using distance information based on range-image-data, in comparison with the image processing using the colors and/or the gradations of pixels. This makes it possible to apply the range-image-data-generating apparatus 1 to the expansion control of an air bag, which requires high reliability and high responsibility.

The range-image-data-generating apparatus 1 may be applied to any other type of system that uses three-dimensional positional information about an object.

Second Embodiment

A second embodiment of the present invention will be described below.

This embodiment differs from the first embodiment in operation of the control signal generating unit 4 and a part of the processing executed by the arithmetic unit 5. Therefore, description will be provided below mainly of the operation of the control signal generating unit 4 of this embodiment and the different part of the processing executed by the arithmetic unit 5 of this embodiment.

Figure 9:
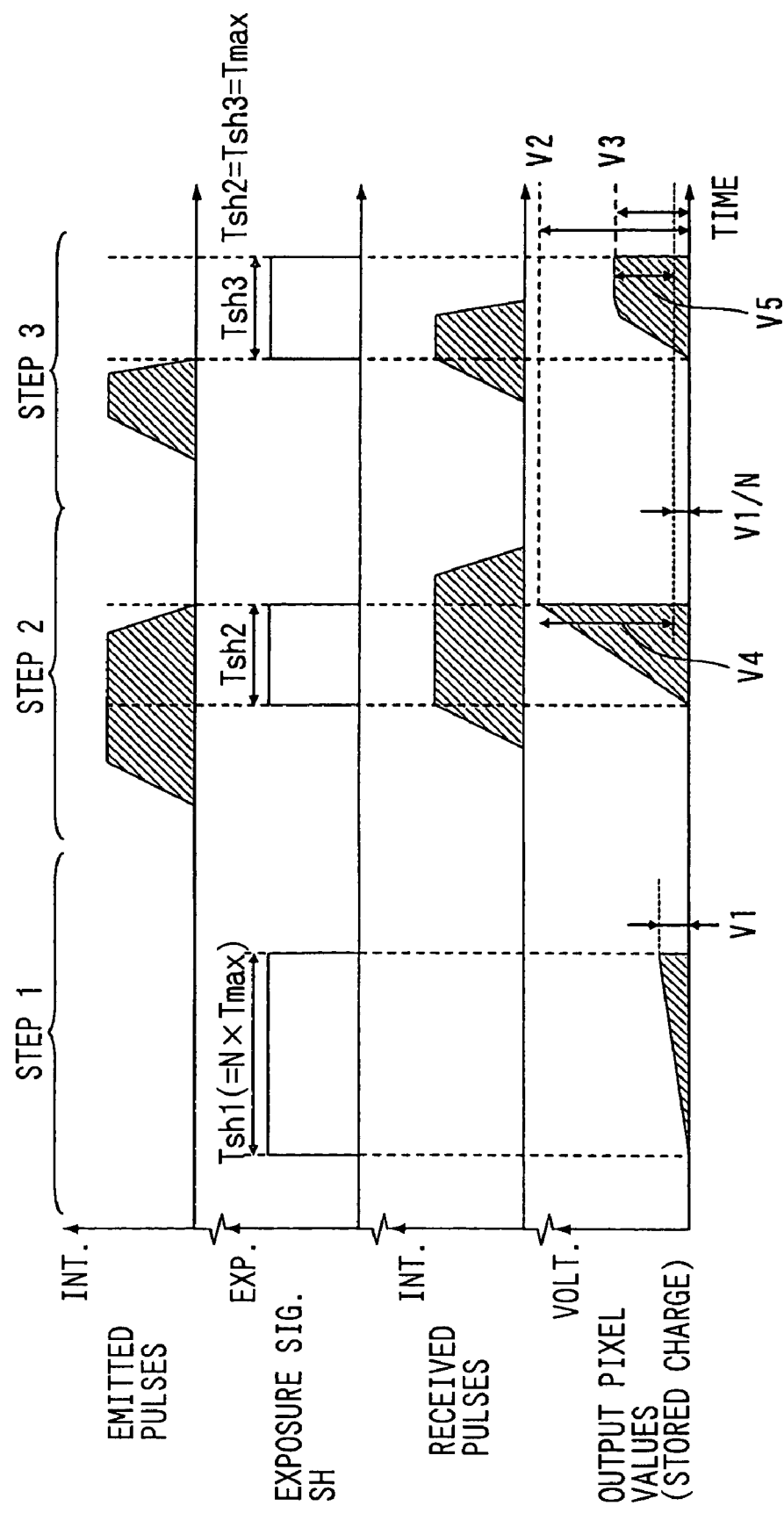
FIG. 9 is a timing chart showing the operation of various parts of the range-image-data-generating apparatus during the range-image-data generation according to a second embodiment.

Referring to FIG. 9, when the control signal generating unit 4 receives the first command from the arithmetic unit 5, the unit 4 generates an exposure signal SH having a pulse width (exposure time) $Tsh1=Tmax \times N$, where N is an integer larger than one (the first step in FIG. 9). When the control signal generating unit 4 receives the second or third command from the arithmetic unit 5, the unit 4 operates in the same manner as in the first embodiment (the second or third step in FIG. 9). In FIG. 9, $Tsh2=Tsh3=Tmax$. FIG. 9 is a timing chart showing the relationship among the pulsed light emitted from the light emitting unit 2, the pulsed light (reflected or scattered light) received by the image receiving unit 3, and the pixel value (output from each unit circuit 80) of each pixel.

At Step S140 of the range-image-data generation in this embodiment, the pixel value V1 of the first image data obtained at Step S110 is divided by N so as to be standardized to a value per unit time Tmax. At Step S140, the standardized pixel value V1/N is subtracted from the pixel value V2 of the second image data obtained at Step S120 so that a pixel value $V4(=V2-V1/N)$ of reference image data is found. Likewise, at Step S150, the standardized pixel value V1/N is subtracted from the pixel value V3 of the third image data obtained at Step S130 so that a pixel value $V5(=V3-V1/N)$ of intensity image data is found. The steps other than Steps S140 and S150 of this embodiment are identical to those of the first embodiment.

As is the case with the first embodiment, the range-image-data-generating apparatus 1 of this embodiment makes it possible to obtain accurate range-image-data. When the total exposure time is enough when the first image data is obtained, this data can be handled as ordinary image data. That is, the provision of the range-image-data-generating apparatus 1 of this embodiment makes it possible to obtain ordinary image data without providing a special apparatus.

By thus setting the exposure time long, because it is possible to obtain a signal of a magnitude proportional to the set time, it is possible to detect the reflected or scattered light even if its intensity is weaker. Consequently, when the emission power of the light emitting unit 2 is the same, it is possible to widen the detection range by improving the sensitivity. When the detection range is the same, it is possible to lower the emission power, thereby increasing the life of the light emitting element and reducing the noise made at the light emitting unit 2.

The long exposure time results in the background light being averaged. The averaging effect reduces the influences of exposure timing jitter etc., so that the distance resolution is improved.

Figure 10:
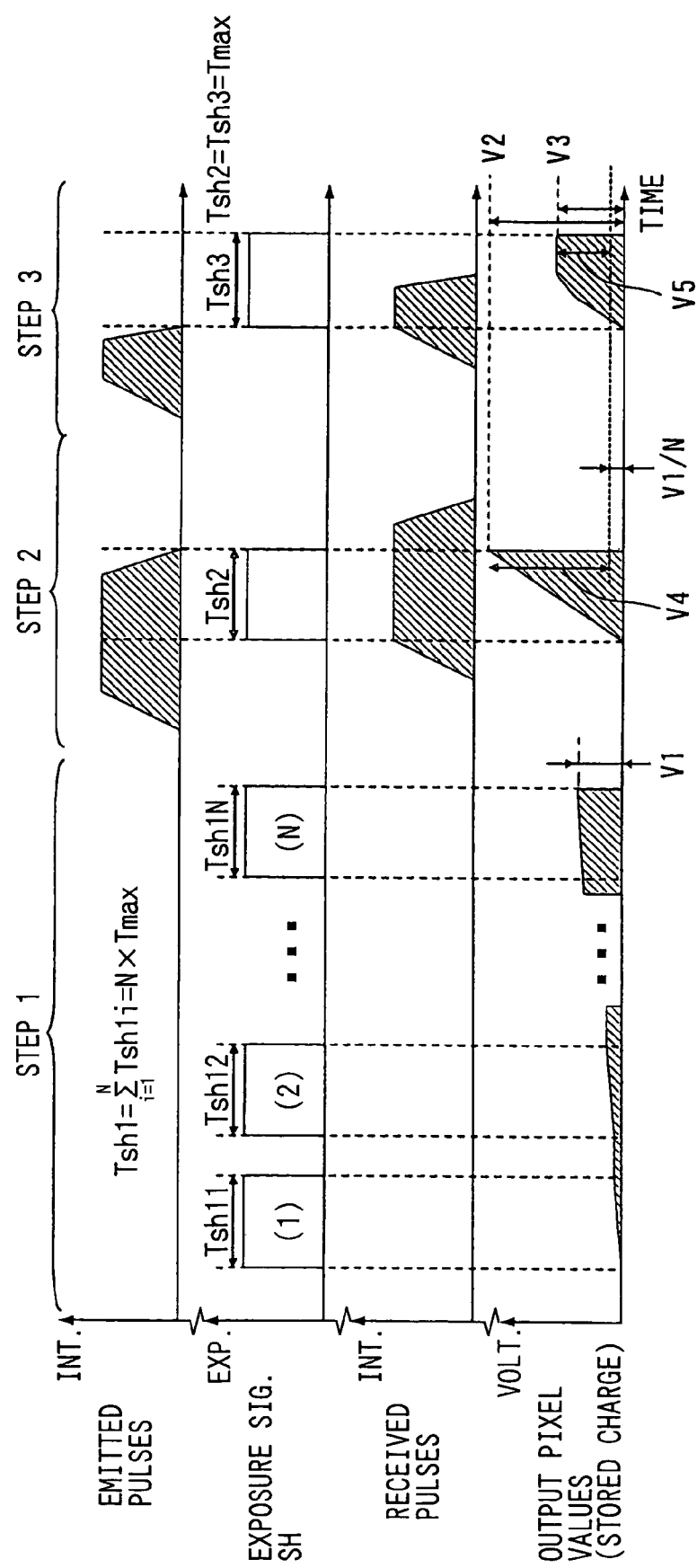
FIG. 10 is a timing chart showing the operation of various parts of the range-image-data-generating apparatus during the range-image-data generation in a modification of the second embodiment.

In this embodiment, when obtaining the first command, the control signal generating unit 4 generates exposure signal SH, the pulse width of which is Tsh1=Tmax×N. Alternatively, as shown in FIG. 10, the control signal generating unit 4 might generate exposure signals SH intermittently N times, the pulse width of which is Tmax. Consequently, when obtaining the first image data, the total exposure time would be Tsh1=Tmax×N (the first step in FIG. 10). At Step S110 of the range-image-data generation, after the exposure is carried out N times, (the first) image data might be obtained from the image receiving unit 3. In this case, the effect is the same with the foregoing range-image-data-generating apparatus 1, except that multiple exposure is carried out N times when obtaining the first image data.

In this embodiment, when obtaining the first image data, the exposure time Tsh1 differs from the exposure times Tsh2 and Tsh3, or multiple exposure is carried out. A similar exposure technique might be applied when obtaining the second or third image data.

Third Embodiment

A third embodiment of the present invention will be described below.

This embodiment differs from the first embodiment in only part of the range-image-data generation. Therefore, mainly the different part will be described.

The range-image-data generation in this embodiment involves executing Step S160 after repeating Steps S110–S150 m times. The pixel values V4 of reference image data calculated m times at Step S140 are accumulated so that an accumulated value VR4 is obtained. The pixel values V5 of intensity image data calculated m times at Step S150 are accumulated so that an accumulated value VR5 is obtained. Step S160 is to calculate the ratio between the accumulated values VR4 and VR5 so as to find a pixel value VR (VR5/VR4) of range-image-data.

The range-image-data-generating apparatus 1 of this embodiment carries out the accumulation while eliminating the noise component V1 due to the background light and the sensor operation. This improves the sensitivity and makes it difficult for the noise component V1 to saturate the output value.

Fourth Embodiment

A fourth embodiment of the present invention will be described below.

This embodiment differs from the first embodiment only in that its arithmetic unit 5 further executes correction value calculation to find a correction value H for correction of a pixel value of range-image-data, and in part of the range-image-data generation. Therefore, mainly these points will be described.

Step S160 of the range image generation in this embodiment is to calculate a pixel value V6 of the range-image-data by the following expression (10) using the correction value H calculated by the correction value calculation, which will be described later on. The steps other than Step S160 in this embodiment are the same as in the first embodiment.

$$V6=V5/V4-H \tag{10}$$

Figure 11:
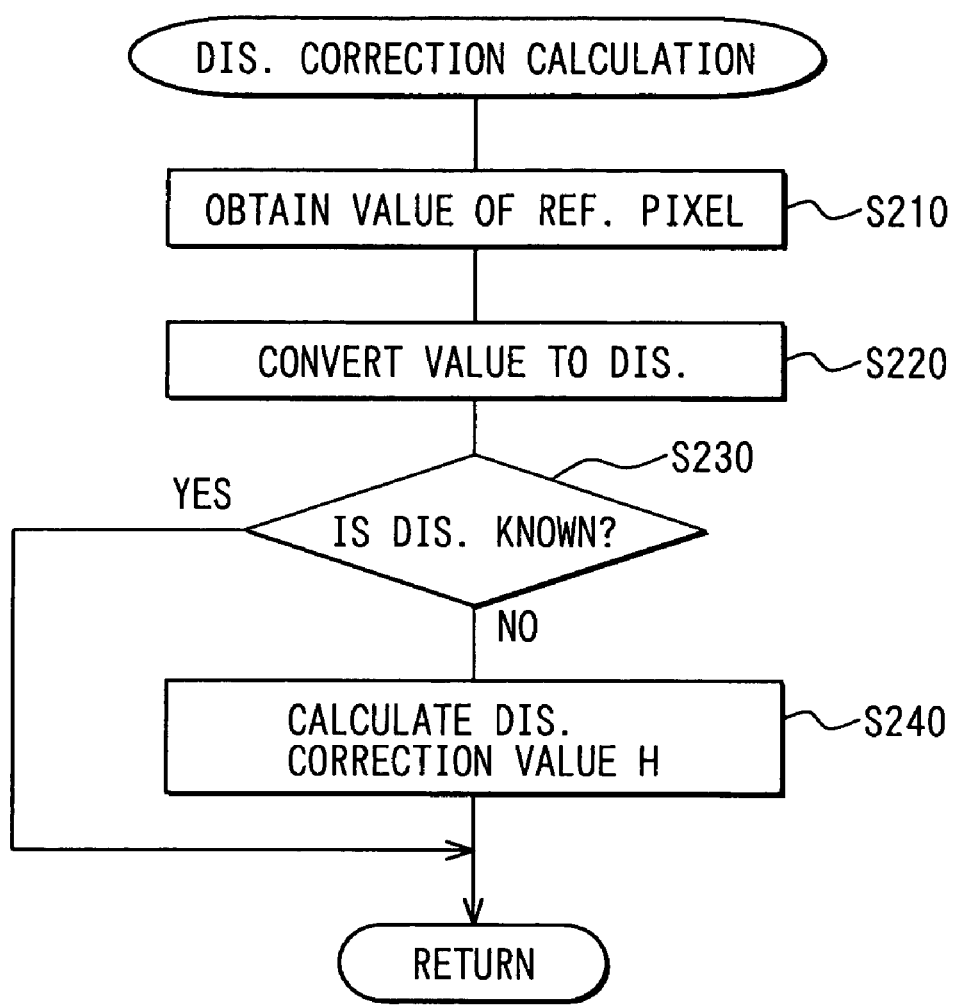
FIG. 11 is a flowchart showing the correction value calculation executed by the arithmetic unit of a range-image-data-generating apparatus according to a fourth embodiment of the present invention.
Figure 12A:
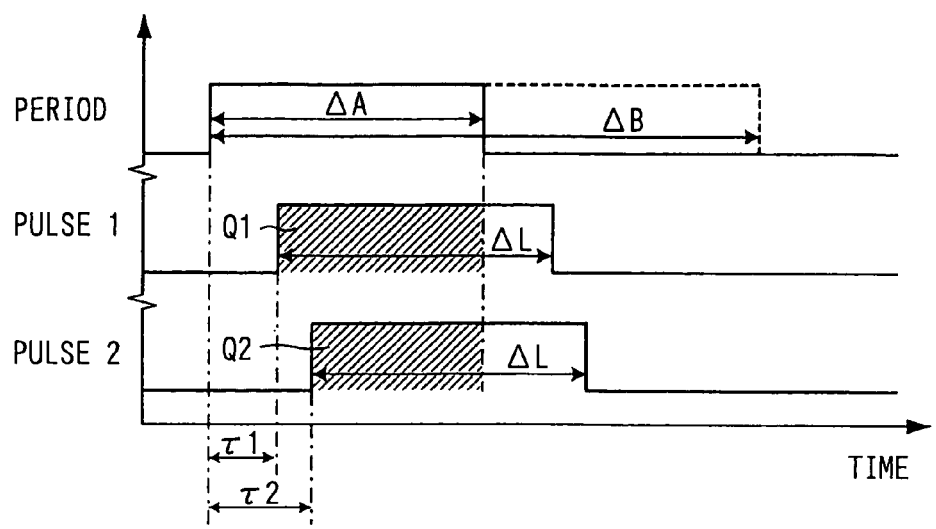
FIGS. 12A and 12B are timing charts showing operation a conventional apparatus of and problems associated therewith.
Figure 12B:
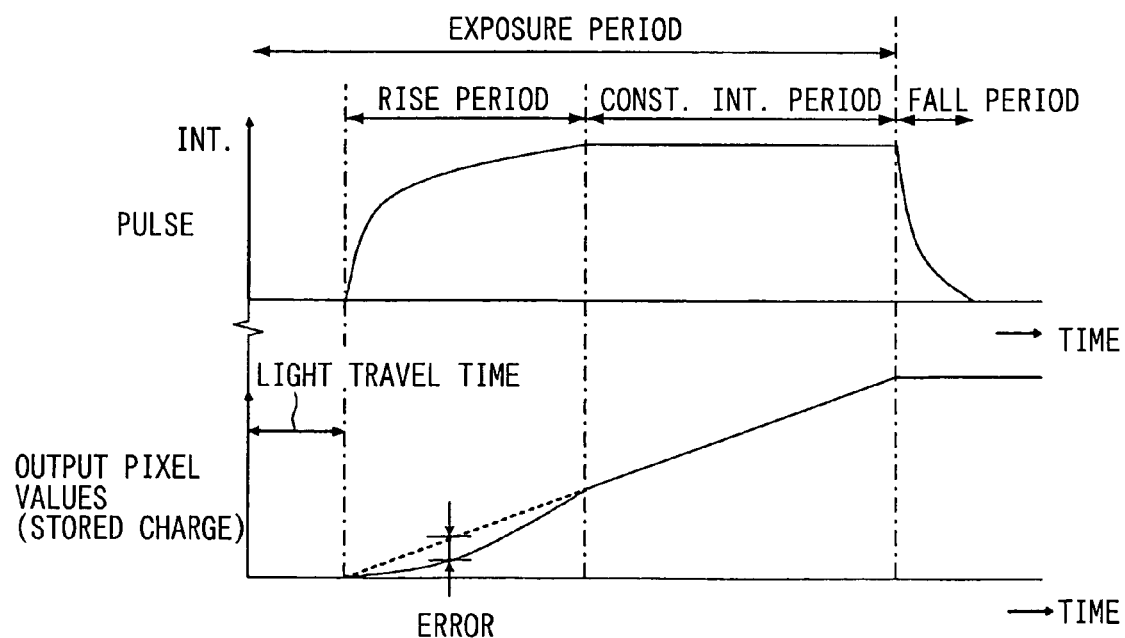

The correction value calculation will be described below along the flowchart shown in FIG. 11.

The correction value calculation requires that the distance between the range-image-data-generating apparatus 1 and one of the objects photographed by the apparatus be already known. For example, when the interior of a car is photographed, this particular object may be one of the center pillars. A pixel of the range image that represents the particular object is a reference pixel. The distance Df between the particular object and the pixel value V of the reference pixel is known.

Step S210 of the correction value calculation is to obtain the pixel value V6f of the reference pixel out of the range-image-data calculated at Step S160 of the range-image-data generation. Step S220 is to multiply the obtained pixel value V6f by the maximum measurable distance Lmax so as to convert the value into a distance Dk. Step S230 is to determine whether this distance Dk and the known distance Df are equal to each other. When the distances Dk and Df are equal, the processing ends immediately. When the distances Dk and Df are different, the processing goes to Step S240 of calculating the correction value H by the following expression (11) and then ends.

$$H=V6f-Df/Lmax \tag{11}$$

The range-image-data-generating apparatus 1 of this embodiment makes it possible to always obtain accurate distance information based on the range-image-data, even if the characteristics of the apparatus 1 vary with the environmental conditions such as the supply voltage and temperature.

In this embodiment, the correction is carried out when the pixel value V6 of the range-image-data is calculated. Alternatively, the correction might be carried out when the distance is calculated from the pixel value V6 of the range-image-data.

In this case, a distance correction value Hd and distance D might be found according to the following expressions (12) and (13), respectively.

$$Hd=V6f\times Lmax-Df \tag{12}$$

$$D=V6\times Lmax-Hd \tag{13}$$

Other Embodiments

In the foregoing embodiments, the exposure times Tsh1–Tsh3 and emission times Tf1–Tf3 are fixed values. Alternatively, the exposure times Tsh1–Tsh3 and emission times Tf1–Tf3 might be variable as the case may be.

Specifically, in the case shown in FIG. 4B, the exposure time Tsh2 is set sufficiently long, and the saturation time taken by the output (pixel value) from the image receiving unit 10 to be saturated is measured. Based on the measured saturation time, the exposure times Tsh2 and Tsh3 are set as long as possible but shorter than it.

Such setting makes it possible to utilize the charge storage capacity of the photosensor 8 to its maximum.

In the foregoing embodiments, the shutter switches 83 and charge reset switches 82 are NMOS field-effect transistors. Alternatively, the switches 82 and 83 might be PMOS field-effect transistors or analog switches that are combinations of NMOS and PMOS transistors. In each unit circuit 80, the photocurrent from the photoelectric conversion element 81 causes the capacitor 84 to store charge. Alternatively, the capacitor 84 might be precharged, and the precharged capacitor 84 might be discharged by the photocurrent from the photoelectric conversion element 81.

In the foregoing embodiments, the output from the image receiving unit 3 is converted into digital values, which are then input into the arithmetic unit 5. The arithmetic unit 5 computes the input digital values to find range-image-data. Alternatively, the analog values output from the image receiving unit 3 might be processed as they are.

In the foregoing embodiments, the first, second, and third image data are obtained in that order at Steps S110, S120, and S130, respectively, but might be obtained in any other order. In the foregoing embodiments, the first image data is obtained (Step S110) every time the range-image-data generation starts. The first image data might be obtained only once when the apparatus starts. The first image data might be obtained in a cycle longer than the starting cycle of the range-image-data generation. The first image data might be obtained when a command is input from the outside.

In the foregoing embodiments, the pixel values V6 of the range-image-data are converted into absolute distances D by being multiplied by the maximum measurable distance Lmax. Alternatively, the pixel values V6 of the range-image-data might be converted into absolute distances D according to a conversion table prepared in advance, which shows the relation between the pixel values V6 and absolute distances D.

The pixel values V6 are converted into absolute distances D by being multiplied by the maximum distance Lmax on the premise that the relation between the pixel values V6 and absolute distances D is linear. In practice, the pixel values V6 of the third image data are influenced by the falling part of the pulsed light. When the influence of the falling part is great, the relation between the pixel values V6 and absolute distances D is nonlinear. When the errors based on the nonlinearity of the relation are not negligible, the conversion method using the conversion table is very effective.

It is preferable that a pixel value V6 not recorded in the conversion table be converted into an absolute distance D by means of a known interpolation calculation. The conversion table may be prepared by measuring the relations between the pixel values V6 and absolute distances D when delivering or shipping the system, and by writing the measured relations into the memory (for example, EPROM) of the arithmetic unit 5.

The description of the invention is merely exemplary in nature and, thus, variations that do not depart from the gist of the invention are intended to be within the scope of the invention. Such variations are not to be regarded as a departure from the spirit and scope of the invention.

Therefore, the present disclosure concerns a method for generating range data. The method generally includes performing a background light exposure for a first predetermined time period so that a reference pixel value (V1) of each of a plurality of unit circuits 80 varies with an intensity of background light. A first pulsed light is emitted toward a distant object and an exposure of a first received reflection of the first irradiated light is performed for a second predetermined time period so that a second pixel value (V2) of each of the plurality of unit circuits 80 varies with an intensity of the reflected emitted light. A second pulsed light is emittted toward a distant object and an exposure of a second received reflection of the second irradiated light is performed for a third predetermined time period so that a third pixel value (V3) of each of the plurality of unit circuits 80 varies with a distance to the distant object. The range data is determined based upon the reference pixel value, second pixel value and the third pixel value, wherein the range data depends only upon the distance to the distant object and is substantially independent of the intensity of the background light. The second predetermined time period preferably begins after a rise time and maximum round trip time of the emitted light. The third predetermined time period is preferably substantially equal to or greater than the maximum round trip time of the emitted light, and the third predetermined time period begins after the rise time and maximum round trip time of the irradiated light.

The present disclosure also concerns an apparatus 1 for generating range-image-data. The apparatus 1 comprises an image receiving unit 3 for receiving a reflection of the emitted pulse light and background light, and for performing a first exposure to generate first image data corresponding to an intensity of background light, a second exposure to generate second image data corresponding to an intensity of the reflected emitted light, and a third exposure to generate third image data corresponding to a distance to the distant object. The image receiving unit 3 comprises a photosensor 8 comprised of a two-dimensional array of charge integration type photoelectric conversion elements 81. The apparatus 1 also includes a control signal generating unit 4 for controlling a light emitting unit 2 to emit pulse light towards a distant object and for controlling the image receiving unit 3. The apparatus 1 also includes an arithmetic unit 5 for receiving the first, second and third image data from the image receiving unit 3 and generating the range data, and for controlling the control signal generating unit 4 so that the first exposure, second exposure, and third exposure are respectively performed at a first predetermined time period, second predetermined time period, and third predetermined time period, wherein during the first predetermined time period, no light is emitted from the light emitting unit 2, wherein the third predetermined time period is substantially equal to or greater than the maximum round trip time of the emitted light, and the third predetermined time period begins after the rise time and maximum round trip time of the irradiated light. Preferably, the arithmetic unit 5 determines reference image data by subtracting the first image data from the second image data, determines an intensity image data by subtracting the first image data from the third image data, and determines the range-image-data by calculating the ratio between the reference and intensity image data.

Regarding the appended claims, a light-emitting means preferably corresponds to the light emitting unit 2. An imaging means preferably corresponds to the image receiving unit 3. An image-data-obtaining means preferably corresponds to the control signal generating unit 4. A range-image-data-generating means preferably corresponds to the arithmetic unit 5. A first image-data-obtaining means, a second image-data-obtaining means and a third image-data-obtaining means all preferably correspond to the arithmetic unit 5. A first arithmetic means, a second arithmetic means and a third arithmetic means preferably correspond to the arithmetic unit 5. A distance-calculating means preferably corresponds to the arithmetic unit 5. A saturation-time-measuring means preferably corresponds to the arithmetic unit 5.

What is claimed is:

1. An apparatus for generating range-image-data, the apparatus comprising:
   a light-emitting means for emitting pulsed light within a preset measuring range, the pulsed light having a rise period, a flat period, and a fall period;
   an imaging means for photographing an object existing in the measuring range, the imaging means including a photosensor comprised of a two-dimensional array of charge integration type photoelectric conversion elements, the photosensor adapted to be exposed adjustably;
   an image-data-obtaining means for obtaining image data by controlling the emission period or the emission-start timing for the light-emitting means and the exposure period or the exposure-start timing for the imaging means, the image data being such that a value of each pixel is the output from one of the photoelectric conversion elements;

a range-image-data-generating means for generating range-image-data based on the obtained image data, the range-image-data comprised of pixels, each having a pixel value according to the distance to the photographed object;

the image-data-obtaining means including a first image-data-obtaining means for obtaining first image data from the imaging means by causing the imaging means to make an exposure, without causing the light-emitting means to emit pulsed light;

the image-data-obtaining means further including a second image-data-obtaining means for obtaining second image data from the imaging means by so setting the emission period or the emission-start timing and the exposure period or the exposure-start timing in order to receive a part of the light reflected or scattered from the object over the whole exposure period, the part corresponding to the flat period of the pulsed light;

the image-data-obtaining means further including a third image-data-obtaining means for obtaining third image data from the imaging means by so setting the emission period or the emission-start timing and the exposure period or the exposure-start timing in order to receive the part of the reflected or scattered light for a time according to the round-trip time for the distance to the object;

the range-image-data-generating means including a first arithmetic means for finding reference image data by subtracting the first image data from the second image data;

the range-image-data-generating means further including a second arithmetic means for finding intensity image data by subtracting the first image data from the third image data;

the range-image-data-generating means further including a third arithmetic means for finding the range-image-data by calculating the ratio between the reference and intensity image data.

2. The apparatus of claim 1, wherein the second image-data-obtaining means sets the exposure period arbitrary and the emission period equal to or longer than the sum of the rise period of the pulsed light, the maximum round-trip time taken by the pulsed light to make a round trip over the distance to the boundary of the measuring range, and the exposure period, and wherein the emission from the light-emitting means starts before the exposure of the photosensor by a time equal to or longer than the sum of the rise period and the maximum round-trip time.

3. The apparatus of claim 1,
wherein the third image-data-obtaining means sets the emission period as the flat period is equal to the maximum round-trip time, and sets the exposure period equal to or longer than the flat period, and
wherein the emission from the light-emitting means starts before the exposure of the photosensor by the sum of the rise period and the maximum round-trip time.

4. The apparatus of claim 1, wherein the exposure periods set by the first to third image-data-obtaining means are equal.

5. The apparatus of claim 1,
wherein at least one of the first and second image-data-obtaining means sets the associated exposure period different from the exposure period set by the third image-data-obtaining means, and wherein the first and second arithmetic means find the reference and intensity-image data by standardizing the pixel values of the first to third image data to values per preset unit time.

6. The apparatus of claim 1, wherein at least one of the exposure periods set by the first to third image-data-obtaining means is divided into a plurality of periods.

7. The apparatus of claim 1, wherein the first and second arithmetic means accumulate pixel values of the reference and intensity image data, and
wherein the third arithmetic means generates the range-image-data based on the reference and intensity image data having the accumulated pixel values.

8. The apparatus of claim 1, further comprising a distance-calculating means for finding the absolute distance to the object based on the range-image-data generated by the third arithmetic means.

9. The apparatus of claim 8, wherein the distance-calculating means finds the absolute distance to the object by multiplying the value of each pixel of the range-image-data by a preset constant.

10. The apparatus of claim 8, wherein the distance-calculating means finds the absolute distance to the object by using a conversion table showing the relation between the pixel value and the absolute distance.

11. The apparatus of claim 1, wherein at least one of the pixels of the photoelectric conversion elements is a reference pixel so set as to receive the light reflected or scattered from a reference object, and wherein the distance between the reference pixel and the reference object is already known;
the distance-calculating means adapted to correct the absolute distance between each pixel and the object in the measuring range based on the absolute distance calculated for the reference pixel.

12. The apparatus of claim 1, further comprising:
a saturation-time-measuring means for measuring the saturation time taken by the output from the photoelectric conversion elements to be saturated while the light-emitting means and the imaging means are making an emission and an exposure, respectively;
the second image-data-obtaining means is adapted to set the exposure period equal to or shorter than the saturation time.

13. The apparatus of claim 1, wherein each of the photoelectric conversion elements is a PIN type photodiode including a P-layer, an N-layer, and an I-layer interposed between the P-layer and the N-layer, the I-layer having low impurity concentration.

14. The apparatus of claim 1, wherein the charge generated by each of the photoelectric conversion elements is stored in a capacitor separate from the conversion elements.

15. A method for generating range-image-data based on image data such that the pixel values of pixels are the output from a photosensor comprised of a two-dimensional array of charge integration type photoelectric conversion elements, the method comprising:
a first step of obtaining first image data from the photosensor by exposing the photosensor without irradiating an object in a preset measuring range with pulsed light having a rise period, a flat period, and a fall period;
a second step of obtaining second image data from the photosensor by irradiating the object with the pulsed light and exposing the photosensor in order to receive a first part of the light reflected or scattered from the object, the first part corresponding to the flat period of the pulsed light;

a third step of obtaining third image data from the photosensor by irradiating the object with the pulsed light and exposing the photosensor in order to receive a second part of the reflected or scattered light for a time according to the round-trip time for the distance to the object, the second part corresponding to the flat and fall periods of the pulsed light;

a fourth step of finding reference image data by subtracting the first image data from the second image data;

a fifth step of finding intensity image data by subtracting the first image data from the third image data; and a sixth step of finding the range-image-data by calculating the ratio between the reference and intensity image data.

16. The method of claim 15, wherein the method is executed by a computer program.

17. An apparatus for generating range-image-data, the apparatus comprising:

an image receiving unit for receiving a reflection of the emitted pulse light and background light, and for performing a first exposure to generate first image data corresponding to an intensity of background light, a second exposure to generate second image data corresponding to an intensity of the reflected emitted light, and a third exposure to generate third image data corresponding to a distance to the distant object, wherein the image receiving unit comprises a photosensor comprised of a two-dimensional array of charge integration type photoelectric conversion elements;

a control signal generating unit for controlling a light emitting unit to emit pulse light towards a distant object and for controlling the image receiving unit; and an arithmetic unit for receiving the first, second and third image data from the image receiving unit and generating the range data, and for controlling the control signal generating unit so that the first exposure, second exposure, and third exposure are respectively performed at a first predetermined time period, second predetermined time period, and third predetermined time period, wherein during the first predetermined time period, no light is emitted from the light emitting unit, wherein the third predetermined time period is substantially equal to or greater than the maximum round trip time of the emitted light, and the third predetermined time period begins after the rise time and maximum round trip time of the irradiated light, wherein the arithmetic unit determines reference image data by subtracting the first image data from the second image data, determines an intensity image data by subtracting the first image data from the third image data, and determines the range-image-data by calculating the ratio between the reference and intensity image data.

* * * * *